(12) United States Patent
Smithson et al.

(10) Patent No.: US 6,496,385 B1
(45) Date of Patent: Dec. 17, 2002

(54) METHOD AND ASSEMBLY FOR INSTALLATION OR REMOVAL OF PRINTED CIRCUIT CARD

(75) Inventors: Stephen D. Smithson, Redwood City, CA (US); Bruce Garrett, Newark, CA (US); Roger Ramseier, Mountain View, CA (US); Steve J. Dean, Chippewa Falls, WI (US); Paul Wiley, Mountain View, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/408,657

(22) Filed: Sep. 29, 1999

(51) Int. Cl.⁷ .............................. H05K 7/10; H05K 7/14
(52) U.S. Cl. ...................... 361/801; 361/740; 361/759; 361/798; 361/754; 439/64; 439/377; 211/41.17
(58) Field of Search ................................ 361/740, 752, 361/753, 759, 801, 802, 803, 796, 797, 798, 754; 439/64, 377; 211/41.17

(56) References Cited

U.S. PATENT DOCUMENTS

| | | | |
|---|---|---|---|
| 5,517,387 A | 5/1996 | Smith | 361/686 |
| 5,657,204 A * | 8/1997 | Hunt | 361/752 |
| 5,706,173 A | 1/1998 | Carney et al. | 361/740 |
| 5,726,857 A | 3/1998 | Salmonson et al. | 361/702 |
| 5,737,194 A | 4/1998 | Hopkins et al. | 361/800 |
| 5,754,406 A | 5/1998 | Hardt et al. | 361/756 |
| 5,815,377 A | 9/1998 | Lund et al. | 361/802 |
| 5,868,585 A | 2/1999 | Barthel et al. | 439/377 |
| 6,053,760 A * | 4/2000 | Bailis et al. | 439/377 |

* cited by examiner

*Primary Examiner*—Jayprakash N. Gandhi
(74) *Attorney, Agent, or Firm*—Schwegman, Lundberg, Woessner & Kluth, P.A.

(57) ABSTRACT

A printed circuit card carrier permits exchange of a card during continuous operation of electronic equipment, and thus without the need to remove an upper part of the enclosure to gain access to the card for upward removal from a motherboard connector. The carrier includes a movable printed circuit card holder that slides along the carrier, perpendicularly towards and away from the motherboard. An actuator accessible from outside the equipment and the holder are coupled together such that motion of the actuator is directed into perpendicular sliding motion of the holder. This either removes the printed circuit card from the motherboard connector or installs it into connector, depending on the direction of motion of the actuator. The carrier is particularly adapted for cards meeting the PCI standard.

42 Claims, 9 Drawing Sheets

US 6,496,385 B1

METHOD AND ASSEMBLY FOR INSTALLATION OR REMOVAL OF PRINTED CIRCUIT CARD

TECHNICAL FIELD

This invention is concerned with installation or removal of printed circuit cards into or from electronic equipment, without the need to suspend operation of the equipment.

BACKGROUND

Many pieces of electrical and electronic equipment are operated continuously during the installation or removal of printed circuit cards from the motherboard of the equipment. During such "hot swapping," it must be possible to access a card location without compromising safety, grounding, operation and electrical shielding of adjacent cards, and so forth. Cards usually stand generally perpendicularly to the motherboard and are connected to the motherboard by pins located on the edge of the card. Thus, there is a need to install or remove a card, without removing the enclosure of the equipment, by moving it in two distinct perpendicular directions: "in then down" in the case of insertion; "up then out" in the case of removal. The small sizes and close mounting of modular electronic equipment make this a difficult task in general, and lead to mis-alignment of installed cards in particular.

U.S. Pat. No. 5,815,377 (Lund et al.) addresses this situation with a card holder that both holds the card and slides on a card guide positioned within the enclosure, above the motherboard connector. Proper alignment with the enclosure during installation of the card guide is accomplished by (1) a rail that guides and holds the card holder from above, and (2) a pair of hooks that extend down from the guide and engage suitable features that prevent the card holder from additional motion. A horizontal cam arrangement below the motherboard moves the features (and thus, through the hooks, the card holder) to redirect horizontal force into vertical force, thus either installing the board into the motherboard connector, or removing it from the motherboard connector.

U.S. Pat. No. 5,868,585 (Barthel et al.) also show a card holder that holds the card and is suspended from an "actuator bar" above the motherboard. Again, a horizontal cam arrangement, but located within the upper actuator bar instead of below the motherboard, redirects horizontal force into vertical force, thus either installing the board into the motherboard connector, or removing it from the motherboard connector.

DISCLOSURE OF INVENTION

One aspect of the invention is a method of installing or removing a printed circuit card during continuous operation of electronic equipment, and thus without the need to remove an upper part of the enclosure to gain access to the card for upward removal from a motherboard connector. The method relies on a generally immovable carrier that supports a movable actuator, which is coupled to a movable circuit card holder. Motion of the actuator is directed into perpendicular motion of the holder with respect to the motherboard. Thus, moving the actuator installs or removes the printed circuit card from its connector on the motherboard.

Other aspects of the invention are preferred embodiments that comprise a carrier positioned to be relatively immovable in the direction perpendicular to the motherboard. These embodiments also comprise a movable printed circuit card holder that slides along the carrier, perpendicularly towards and away from the motherboard. An actuator accessible from outside the equipment is movably supported by the carrier. The actuator and the holder are coupled together such that motion of the actuator is directed into perpendicular sliding motion of the holder. This either removes the card from its connector on the motherboard, or installs the card into the connector, depending on the direction of motion of the actuator.

One preferred embodiment of the actuator employs a sliding member having at least one angled slot coupled with force transfer tabs located on the card holder. Horizontal motion of the actuator produces perpendicular motion of the holder. Another preferred embodiment of the actuator comprises a rotatable shaft bearing at least one pinion gear engaged with a rack gear on the holder. Rotational motion of the shaft produces the perpendicular motion of the holder.

All aspects of the invention are particularly suitable for cards meeting the PCI standard, but this is not a requirement.

DETAILED DESCRIPTION

Figure 1:
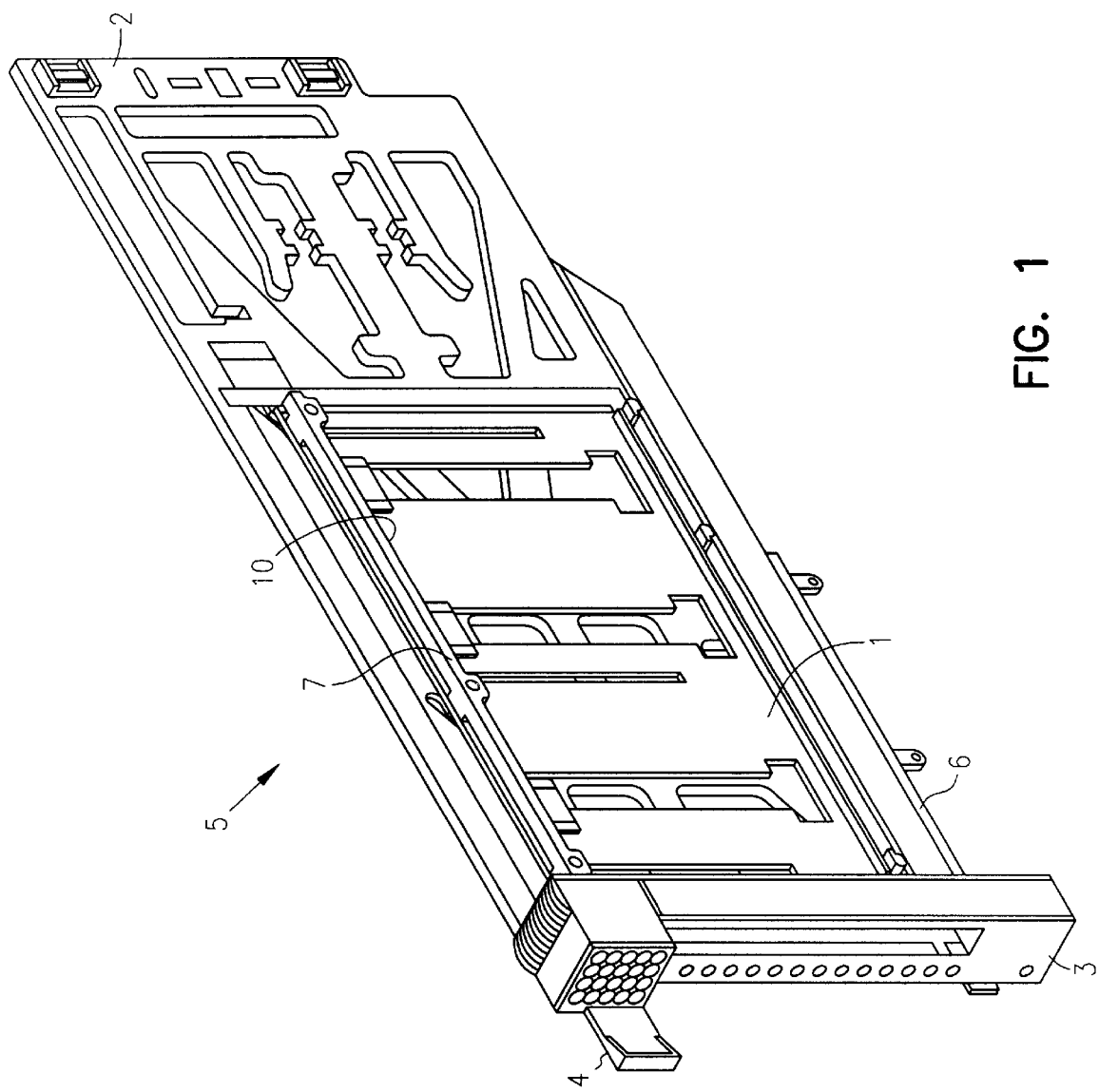
FIG. 1 is a perspective view of one fully-assembled embodiment of the invention.
Figure 2:
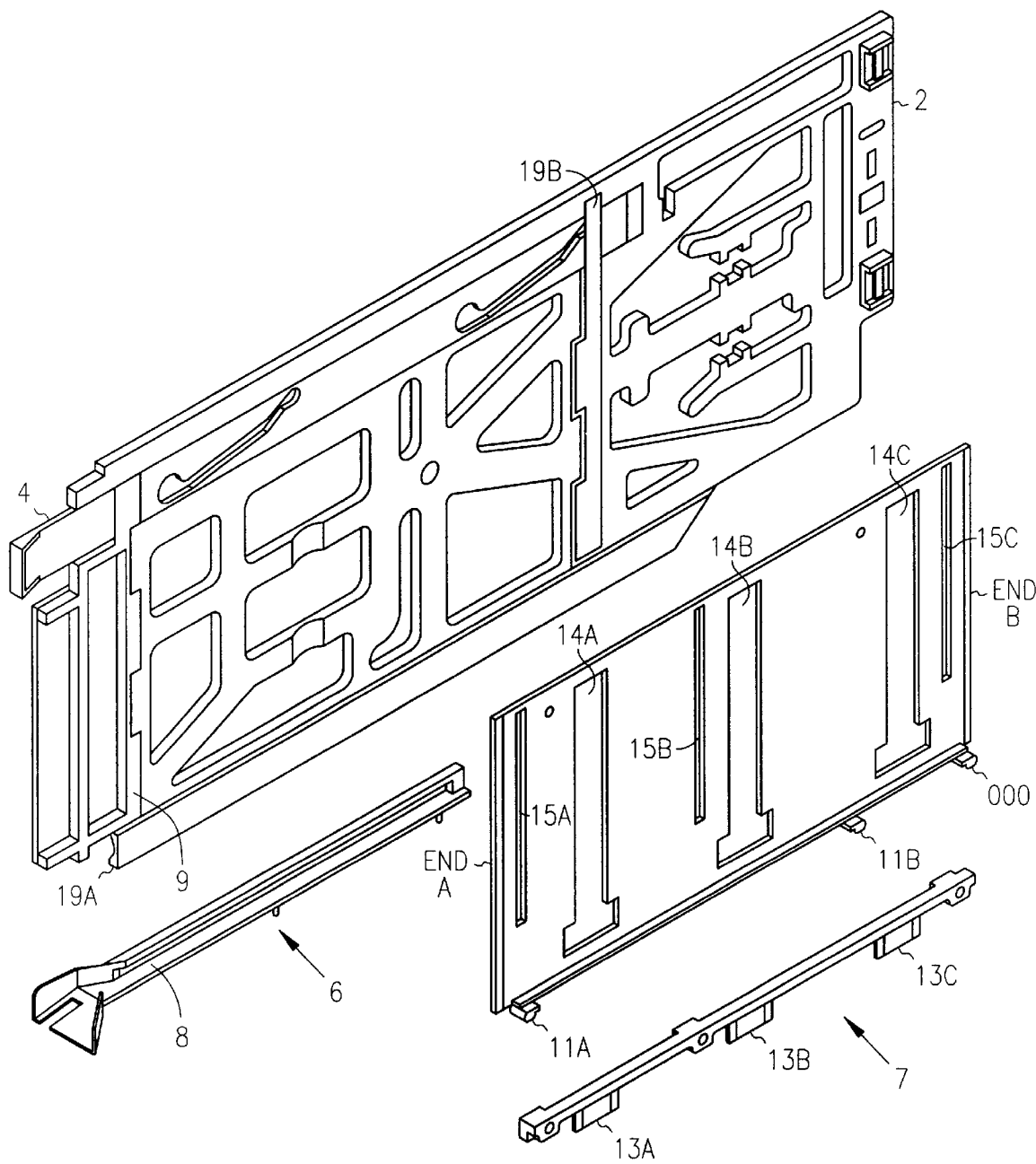
FIG. 2 is an exploded perspective view showing certain components of the embodiment of FIG. 1.

FIG. 1 is a perspective view of one fully-assembled embodiment of the invention. FIG. 2 is an exploded perspective view showing certain components of the embodiment of FIG. 1 and omitting other components, as described below. The embodiment shown in these and all other Figures is specifically designed for printed circuit cards meeting the well-known PCI specification, but this is only a preferred embodiment and not a requirement of the invention.

In FIGS. 1 and 2, the completed assembly 5 comprises card holder 1, carrier 2, EMI shielding 3 (shown in FIG. 1 only), actuator 4, and vertical adjuster 7 (shown in FIG. 2 only). The assembly 5 is adapted to be held in place by guide block 6. As described below, EMI shielding 3 is preferred but not essential to the function of the remainder of assembly 5.

Figure 8:
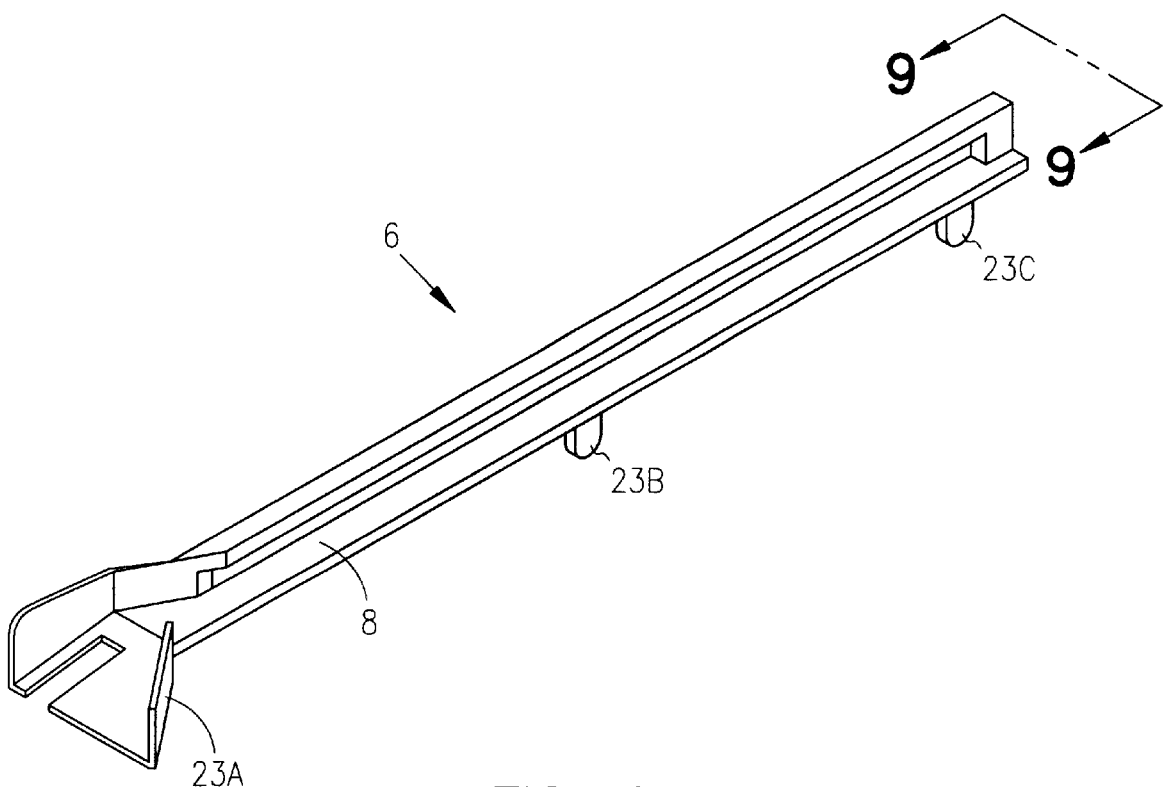
FIG. 8 is a perspective view of the guide block component of the embodiment of FIGS. 1 and 2.
Figure 9:
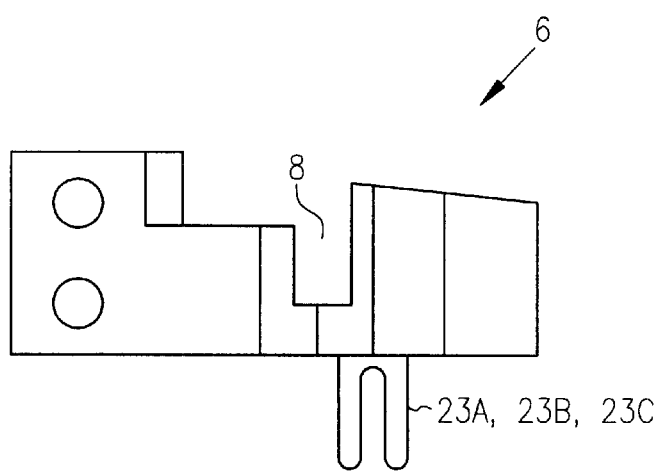
FIG. 9 is an end view taken along the lines 9—9 of FIG. 8.

In use, guide block 6 is attached by any convenient means to a motherboard (not shown) located below guide block 6 and generally perpendicular to the face of assembly 5. As shown in FIGS. 8 and 9, the preferred means for attachment of guide block 6 is at least one flared lug, preferably (and as shown), a set of flared lugs. Each lug is sized and shaped to snap easily into a corresponding feature in the motherboard, yet resist removal once installed. A set of three flared lugs is most preferred; FIG. 8 shows only two flared lugs 23b and 23c because the third flared lug 23a is hidden below the open, wider end of guide block 6.

In commercial use, a guide block 6 will be provided pre-attached to the motherboard adjacent each connector (not shown) that is provided for immediate or future installation of a printed circuit card. Assembly 5 may be provided already installed in the equipment enclosure, with or without an installed card; or, assembly 5 will be provided only when a card is to be installed onto the motherboard, such as would be the case when "open" or "available" connectors are provided for future enhancement to the equipment.

In the preferred embodiment, assembly 5 is supported from below by guide block 6 when assembly 5 is slid into guide slot 8. This positions complementary mating slot 9, located at the lower edge of carrier 2, into guide slot 8. As shown, the opening into the guide block is flared outward, so that carrier 2 may initially be inserted at varying angles, but as carrier 2 is inserted further, the complementary design of guide slot 8 and mating slot 9 ensure that carrier 2 is oriented perpendicular to the motherboard, and then directed straight into the electronics enclosure (not shown). Once in place, carrier 2 is generally immovable in the direction perpendicular to the motherboard. Since card holder 1 is positioned parallel to carrier 2, it also is perpendicular to the motherboard, as is any printed circuit card (not shown) held in holder 1.

If employed, EMI shielding 3 is slotted (as shown) or otherwise adapted to permit access to actuator 4. The exact design of EMI shielding 3 is determined by standard engineering considerations not discussed here.

Vertical adjuster 7 allows assembly 5 to accommodate cards of varying height, as described further below. Vertical adjuster 7 also incorporates upper card support rail 10, which helps hold the card in place. If only standard height cards are considered, vertical adjuster 7 is not necessary; however, it is preferred that the printed circuit card (not shown) be supported on its upper edge (that is, the edge away from the motherboard or toward the upper portion of FIGS. 1 and 2), and therefore in this instance card holder 1 should be suitably modified for this purpose.

The length of vertical adjuster 7 is also preferred to be nearly the entire length of holder 1, but the invention includes embodiments in which vertical adjuster 7 is shorter than that. Such embodiments may require modifications to holder 1, such as a recessed portion of holder 1 sized and shaped to accommodate vertical adjuster 7, and relocation of upper rail 10 from vertical adjuster 7 into the portion of holder 1 that is outside the recessed portion.

Figure 3:
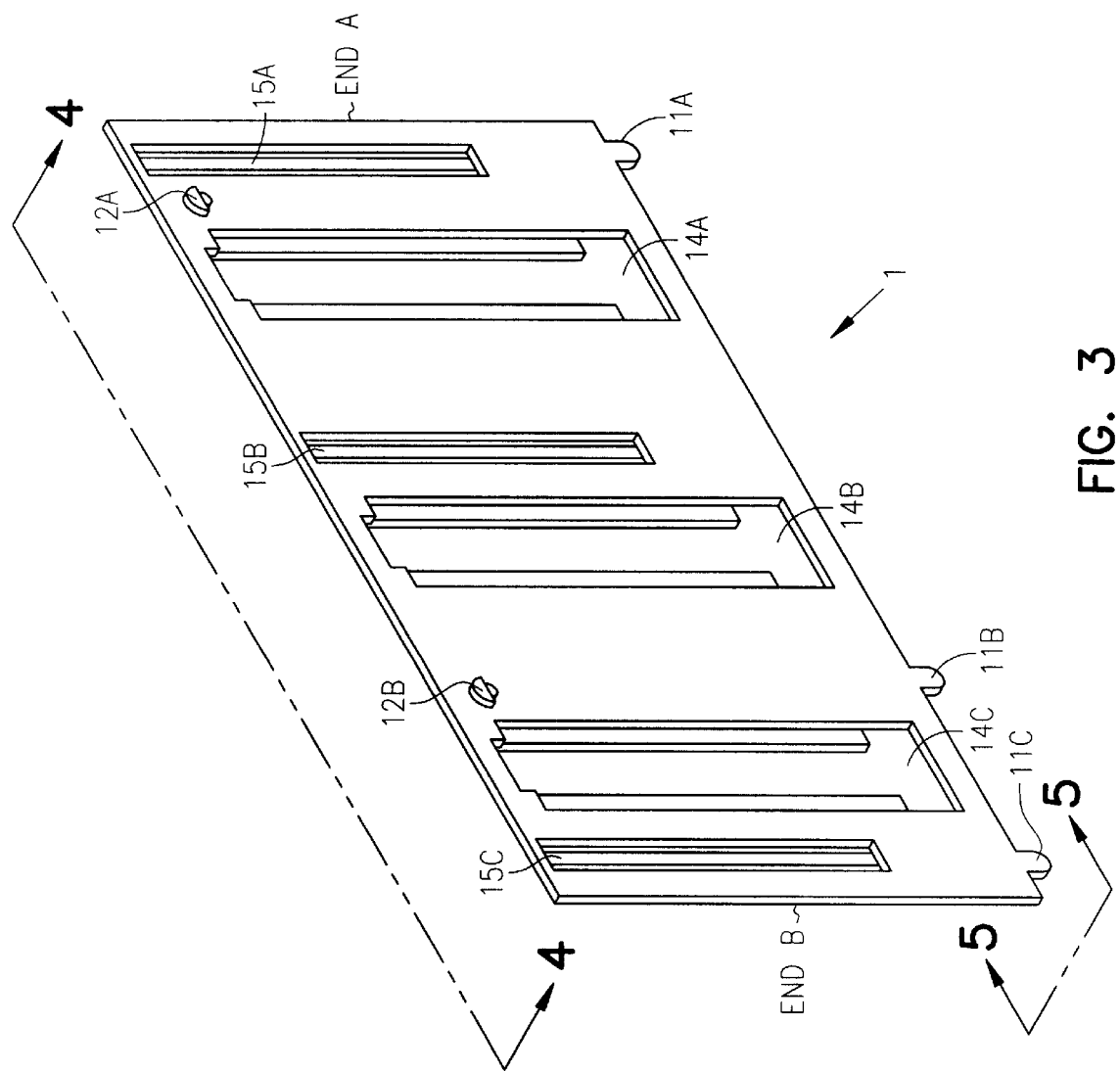
FIG. 3 is a reversed perspective view of the card holder component of the embodiment of FIGS. 1 and 2.
Figure 4:
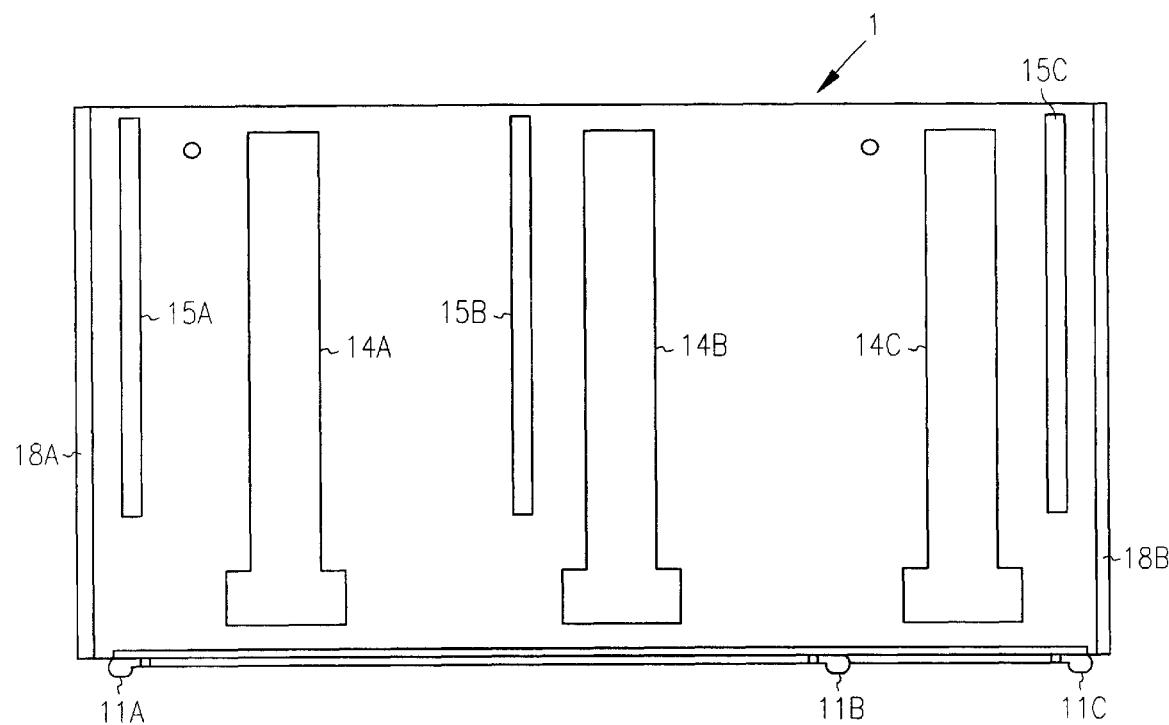
FIG. 4 is a side view taken along the lines 4—4 of FIG. 3.
Figure 5:
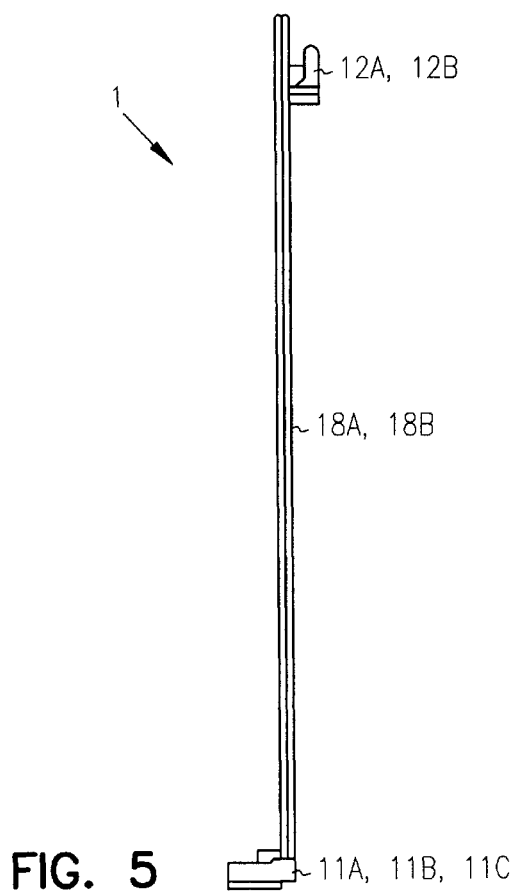
FIG. 5 is an end view taken along the lines 5—5 of FIG. 3.

FIGS. 3, 4 and 5 show holder 1 in more detail. Note that FIG. 3 is a reversed perspective from that of FIGS. 1 and 2, as may be seen by considering the locations of "End A" and "End B" as indicated in the Figures.

Holder 1 is sized to hold a standard card in place between upper card support rail 10 and lower card support tabs 11a, 11b, and 11c. The use of three lower card support tabs is preferred but not required; one or more well-placed and sized tab(s), or a continuous or segmented lower card support rail would be suitable, as would be any other means of holding the lower edge of the card in place.

The overall length of holder 1 is arbitrary but should be sufficient to hold the card in place for proper operation.

Holder 1 includes two force transfer tabs 12a and 12b that are sized and shaped to complement features of actuator 4 as described further below.

Figure 10:
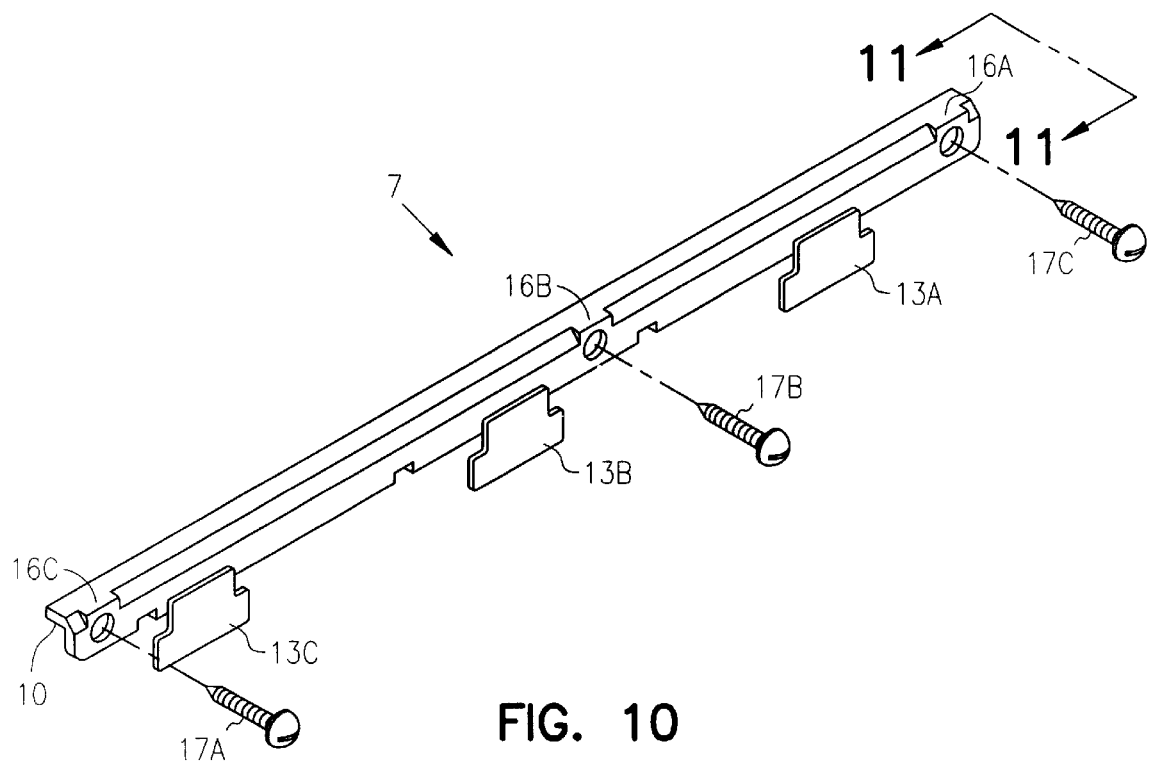
FIG. 10 is a perspective view of the vertical adjuster component of the embodiment of FIG. 2 (it is not shown in FIG. 1).
Figure 11:
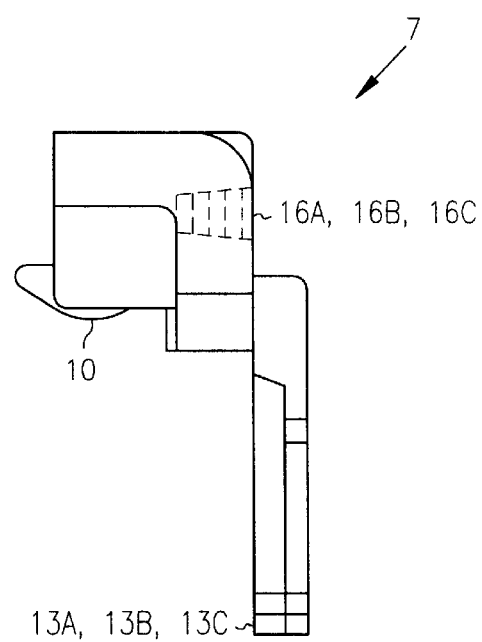
FIG. 11 is an end view taken along the lines 11—11 of FIG. 10.

Vertical adjuster 7 is positioned on the face of holder 1 by sliding it up and down. Turning to FIG. 10 (also a reversed perspective view) and FIG. 11 in addition to FIGS. 3, 4, and 5, vertical adjuster 7 has three wide tabs 13a–c that fit in wide slots 14a–c, respectively, and permit motion only in the vertical direction. To hold vertical adjuster 7 in place, any convenient means is suitable, including the preferred set screws 17a–c that pass through narrow slots 15a–c into holes 16a–c. The number (three) of tabs, wide slots, set screws, narrow slots, and holes is preferred only and not a limitation on the scope of the invention.

Figure 6:
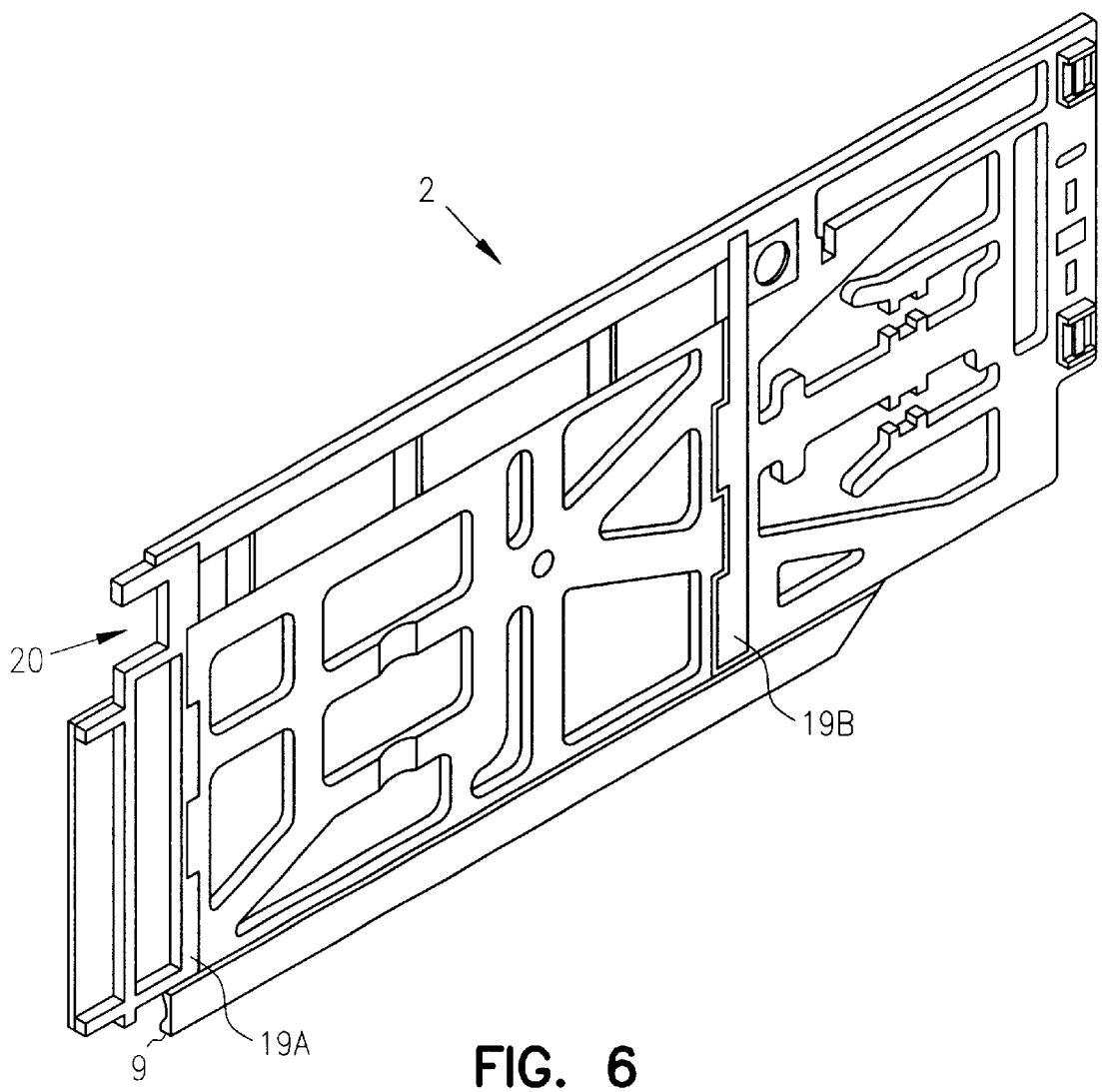
FIG. 6 is a perspective view of the carrier component of the embodiment of FIGS. 1 and 2.

Vertical motion of holder 1 against carrier 2 is permitted by any suitable means, such as the vertical holder guides 18a and 18b in holder 1, as shown in FIGS. 2, 3, 4 and 5; and corresponding vertical holder guide slots 19a and 19b in carrier 2, as shown in FIGS. 2 and 6. These features together ensure that holder 1 moves only up and down with respect to carrier 2 and thus with respect to the motherboard.

Figure 7:
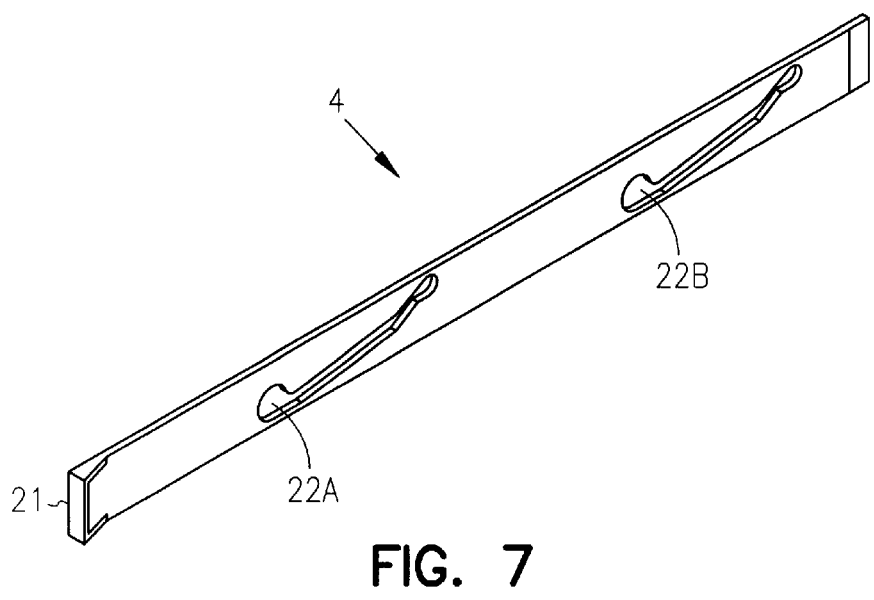
FIG. 7 is a perspective view of the actuator component of the embodiment of FIGS. 1 and 2.

FIG. 6 is a perspective view of carrier 2. In addition to the features discussed above, carrier 2 supports actuator 4, which is coupled to the holder 1, but permits actuator 4 to move with respect to carrier 2. In the specific embodiment shown, carrier 2 defines actuator slot 20 that is sized and shaped to accept but not prevent the motion of actuator 4, which is shown in detail in FIG. 7. By inserting or removing actuator 4 by use of actuator handle 21, actuator slots 22a and 22b are forced against force transfer tabs 12a and 12b (FIG. 3) of card holder 1. Because card holder 1 is constrained to move only vertically, and actuator slots 22a and 22b are suitably angled to permit vertical motion despite the horizontal motion of actuator 4, the horizontal motion applied to actuator 4 is directed to produce the perpendicular motion of holder 1.

This makes it possible to move the printed circuit card held in holder 1 vertically into or out of position in its connector on the motherboard by simply moving actuator 4 once the entire assembly has been inserted laterally into the electronics enclosure. It is not necessary to remove the upper portion of the electronics enclosure or otherwise create any additional space for vertical movement of the printed circuit card during the process of installing it into or removing it from the motherboard connector.

Figure 12:
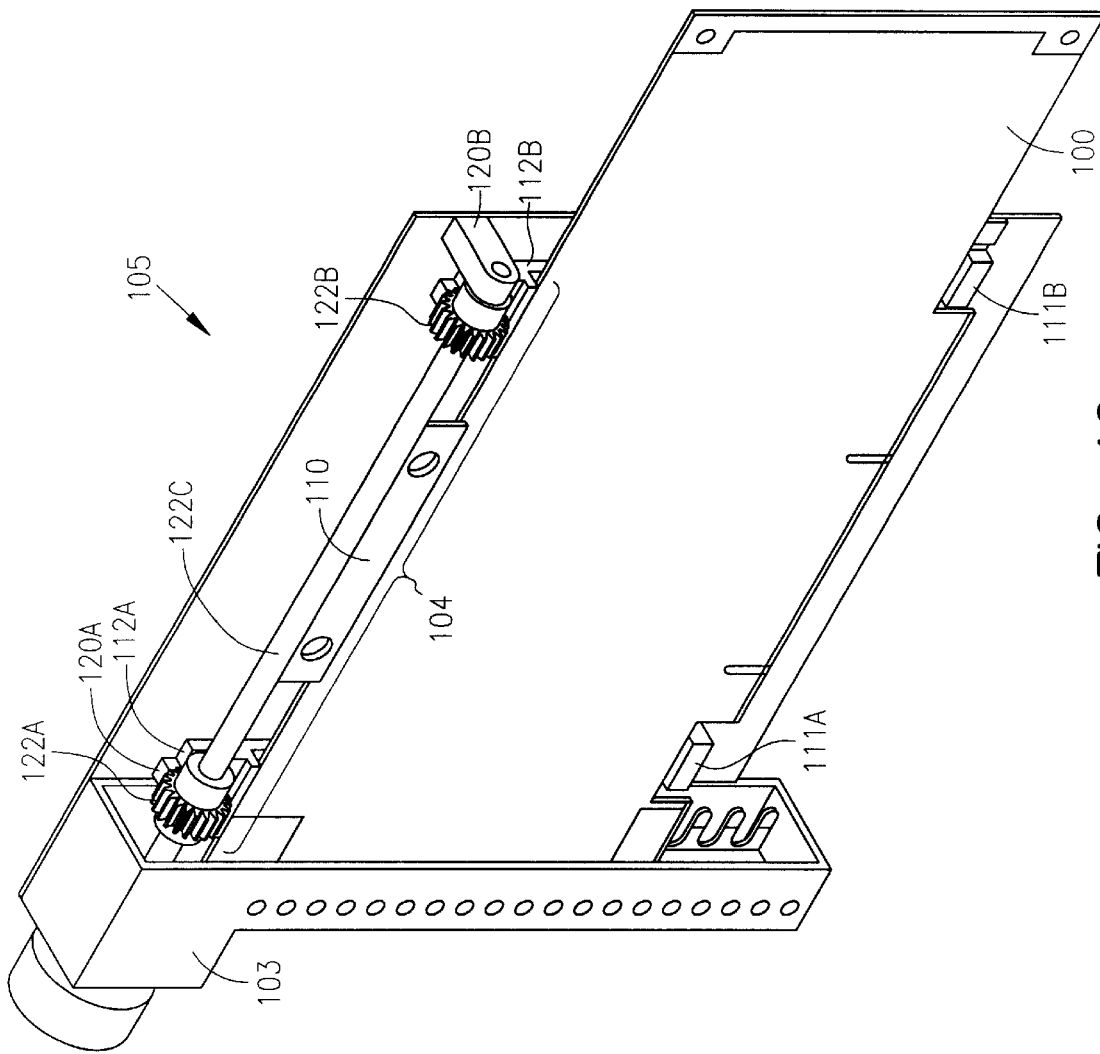
FIG. 12 is a perspective view of another embodiment of the invention.
Figure 13:
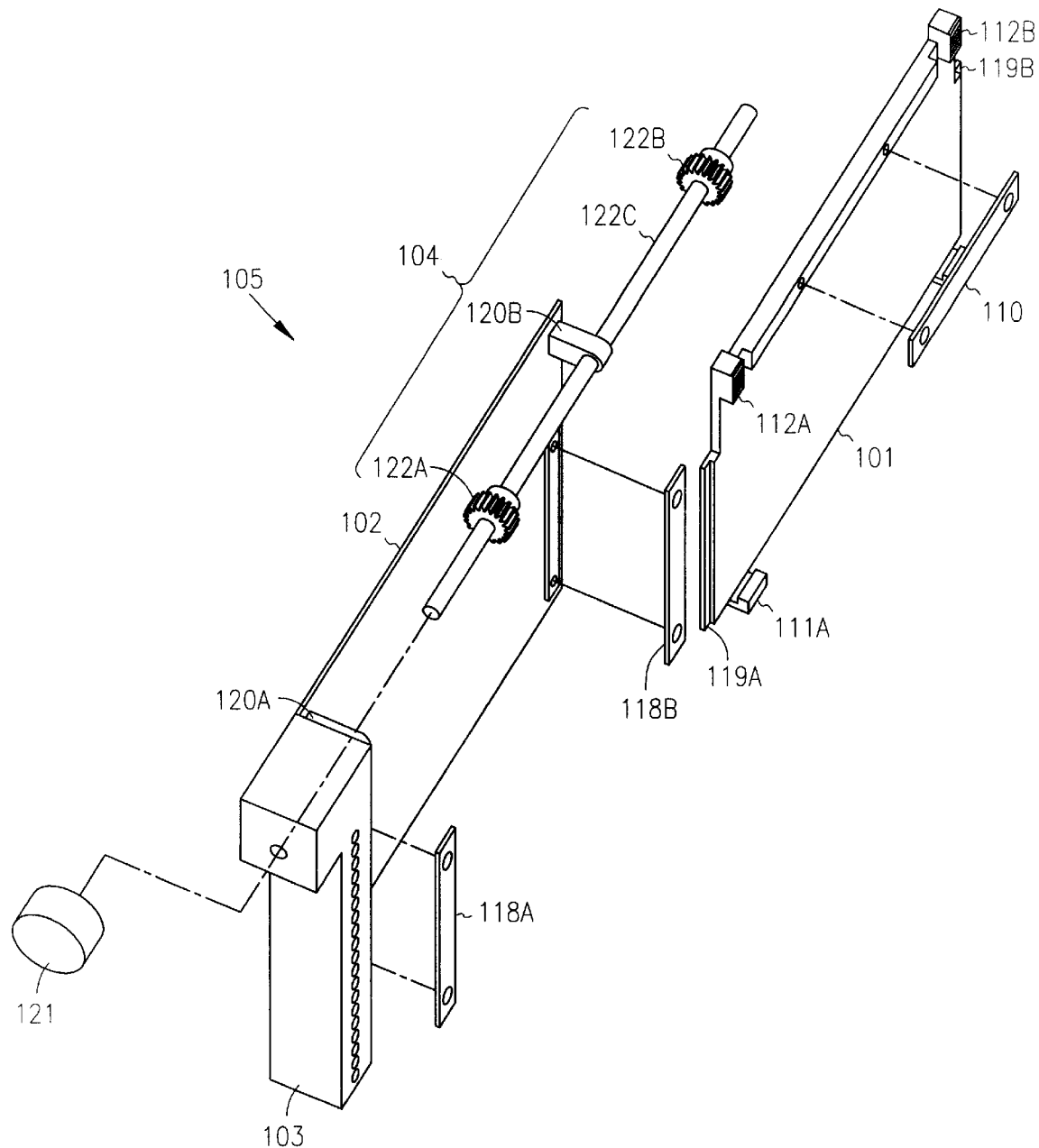
FIG. 13 is an exploded reversed perspective view showing certain components of the embodiment of FIG. 12.

FIG. 12 is a perspective view of another embodiment of the invention. FIG. 13 is an exploded reversed perspective view showing certain components of the embodiment of FIG. 12 and omitting other components, as described below. Again, the embodiment shown in these Figures is specifically designed for printed circuit cards meeting the well-known PCI specification, but this is only a preferred embodiment and not a requirement of the invention.

FIGS. 12 and 13 show that assembly 105 comprises card holder 101 (hidden in FIG. 12 by circuit card 100, which is omitted from FIG. 13), carrier 102, EMI shielding 103 (preferred but not essential to the function of the remainder of assembly 105), and actuator 104.

Assembly 105 may be provided already installed in the equipment enclosure, with or without an installed card 100;

or, assembly 105 will be provided only when card 100 is to be installed onto the motherboard, such as would be the case when "open" or "available" connectors are provided for future enhancement to the equipment. Assembly 105 may be held in place by any convenient means (not shown), provided that once assembly 105 is in place, carrier 102 is generally immovable in the direction perpendicular to the motherboard. Since card holder 101 is positioned parallel to carrier 102, it also is perpendicular to the motherboard, as is circuit card 100 since it is held in holder 101.

If employed, EMI shielding 103 defines an opening (as shown only in FIG. 13, a circular opening), or is otherwise adapted to permit user access to actuator 104. The exact design of EMI shielding 103 is determined by standard engineering considerations not discussed here. Thus, other components of a complete shielding system (e.g., gaskets for the circuit card) are not shown but would be preferred in a commercial embodiment.

Holder 101 is sized to hold card 100 in place between upper card support rail 110 and lower card support tabs 111a, and 111b. The use of two lower card support tabs is preferred but not required; one or more well-placed tab(s), or a continuous or segmented lower card support rail similar to upper card support rail 110 would be suitable, as would be any other means of holding the lower edge of the card in place.

The overall length of holder 101 is arbitrary but should be sufficient to hold card 100 in place for proper operation. As FIG. 12 shows, the length of holder 101 may be less than the length of card 100 itself and still provide adequate support.

To hold upper card support rail 110 in place, any convenient means is suitable, such as set screws (not shown).

Vertical motion of holder 101 against carrier 102 is permitted by any suitable means, such as the vertical holder guides 118a and 118b and corresponding vertical holder guide slots 119a and 119b. These features together ensure that holder 101 moves only up and down with respect to carrier 2 and thus with respect to the motherboard.

In addition to the features discussed above, carrier 2 supports a movable actuator 104 that is coupled to the holder 101. In the specific embodiment shown, actuator 104 comprises rotatable shaft 122c which in turn bears two pinion gears 122a and 122b; carrier 102 defines two shaft mounting brackets 120a and 120b that support shaft 122c in place yet permit it to rotate about its axis. Shaft 122c extends through EMI shielding 103. By rotating knob 121 on the exterior of the assembly, pinion gears 122a and 122b engage and move the rack gears 112a and 112b that are on holder 101. Because card holder 101 is constrained to move only vertically, the rotational motion applied to knob 121 (and thus to actuator 104) produces the perpendicular motion of holder 101.

This makes it possible to move the printed circuit card 100 held in holder 101 vertically into or out of position in its connector on the motherboard by simply moving actuator 104 once the entire assembly has been inserted laterally into the electronics enclosure. It is not necessary to remove the upper portion of the electronics enclosure or otherwise create any additional space for vertical movement of the printed circuit card during the process of installing it into or removing it from the motherboard connector.

The distance that the circuit card must travel to become engaged or disengaged is easily accommodated by proper adjustment of the length of rack gears 12a and 12b, the number of teeth employed on both the rack gears and the pinion gears, and so forth, all in accordance with known principles. In the preferred embodiment, the diameter of knob 121 is approximately 4.4 millimeters (0.17 inches) in diameter so that only a half-rotation of knob 121 is required to move the card holder the entire desired distance of approximately 7.6 millimeters (0.3 inches), either up or down. This amount of rotation is comfortably provided by a simple rotation of the wrist and a 1:1 ratio of gears. In other embodiments, other diameters, distances, rotation angles, and gear ratios could be used.

Also, two sets of corresponding rack and pinion gears are preferred, but in general the invention may be practiced with any number of gear pairs.

FIGS. 12 and 13 do not show any vertically adjustable means to hold the upper edge of the printed circuit card, nor do they show any means to hold the carrier in a position perpendicular to the motherboard. Each of these aspects of the invention may be practiced with any rotational actuator embodiment, including but not limited to the rack-and-pinion embodiments shown in FIGS. 12 and 13. The omission of these features from these Figures is only for purposes of illustration and should not be construed as a limitation on the scope of the invention.

The advantages of the present invention compared to the card holder of U.S. Pat. No. 5,815,377 (Lund et al.) are apparent. The present invention does not require a card guide attached to the top of the electronics enclosure or any other kind of support from above the card holder. Nor does the present invention employ a pair of hooks or any similar means to connect the "camming means" of Lund et al. to the card holder. Similarly, the present invention is distinguished from the card holder of U.S. Pat. No. 5,868,585 (Barthel et al.) by the lack of an "actuator bar" above the motherboard, along with any horizontal cam arrangement located within that actuator bar. Also, card holder 1 of the present invention does not define actuator slots 22a and 22b, as those features are defined in separate actuator 4, whereas in the Barthel et al. design, the retainer frame that holds the printed circuit card also defines the slots that form part of the actuator mechanism.

As is well-known, electronics equipment, motherboards, and printed circuit cards can be oriented in virtually any direction. Thus, as used in the entire disclosure above, the terms "horizontal," "vertical," "upward," "lateral," etc. identify only relative directions with respect to the motherboard of such equipment regardless of the absolute orientation of the motherboard.

We claim:

1. A method of positioning a printed circuit card with respect to a motherboard, comprising:

providing a carrier generally immovable with respect to the motherboard, and an actuator movably supported by the carrier, holding the printed circuit card with a holder movable with respect to the motherboard, coupling the actuator to the holder such that motion of the actuator is directed into perpendicular motion of the holder with respect to the motherboard, and moving the actuator to position the printed circuit card.

2. The method of claim 1, in which the perpendicular motion of the holder is toward the motherboard so as to install the printed circuit card onto the motherboard.

3. The method of claim 1, in which the perpendicular motion of the holder is away from the motherboard so as to remove the printed circuit card from the motherboard.

4. The method of claim 1 in which the motion of the actuator is rotational.

5. The method of claim 1 in which the motion of the actuator is lateral.

6. The method of claim 1 in which coupling the actuator to the holder comprises engaging at least one set of gears.

7. The method of claim 1, further comprising constraining motion of the holder to ensure that the holder moves only perpendicularly with respect to the motherboard.

8. The method of claim 1, further comprising mounting the carrier to the motherboard such that the motherboard holds the carrier in place from below.

9. A printed circuit card carrier assembly, comprising:
   a carrier adapted to be mounted adjacent and generally perpendicular to a motherboard, such that the carrier, when mounted, is generally immovable in the direction perpendicular to the motherboard,
   a relatively movable printed circuit card holder that slides along the carrier, perpendicularly towards and away from the motherboard,
   an actuator movably supported by the carrier, the holder and the actuator being coupled together such that motion of the actuator is directed into perpendicular sliding motion of the holder.

10. The assembly of claim 9, in which the holder and actuator are coupled together such that the motion of the actuator is rotational.

11. The assembly of claim 10, in which the actuator comprises at least one shaft-mounted pinion gear, and the holder comprises at least one rack gear engaging the pinion gear.

12. The assembly of claim 9, in which the holder and actuator are coupled together such that the motion of the actuator is horizontal.

13. The assembly of claim 12, in which the carrier defines a slot in which the actuator slides laterally.

14. The assembly of claim 13, in which the holder and actuator are coupled together by at least one angled slot defined by the actuator and at least one complementary tab defined by the holder.

15. The assembly of claim 9, in which the holder further comprises a rail to support a printed circuit card.

16. The assembly of claim 9, in which the holder further comprises at least one tab to support a printed circuit card.

17. The assembly of claim 9, in which the holder further comprises guides, and the carrier comprises corresponding guide slots, which together ensure that the holder slides only perpendicularly towards and away from the motherboard.

18. The assembly of claim 9, further comprising a vertical adjuster adapted to hold an upper edge of a printed circuit card.

19. The assembly of claim 18, in which the carrier has a recessed portion sized and shaped to accommodate the vertical adjuster.

20. The assembly of claim 18, in which the vertical adjuster further comprises tabs, and the holder comprises corresponding slots, which together ensure that the vertical adjuster slides only perpendicularly towards and away from the motherboard.

21. The assembly of claim 18, further comprising means for holding the vertical adjuster in place to accommodate printed circuit cards of varying heights.

22. The assembly of claim 9, in combination with a guide block adapted to be mounted to the motherboard to support the carrier in place from below.

23. The assembly of claim 9, in combination with a guide block adapted to be mounted to the motherboard to support the carrier in place from below, in which the carrier and the guide block each comprise one of a pair of complementary slots adapted to support the carrier perpendicular to the motherboard.

24. The assembly of claim 9, in combination with a guide block adapted to be mounted to the motherboard to support the carrier in place from below, in which the guide block comprises a flared end that permits insertion of the carrier at varying angles.

25. The assembly of claim 9, in combination with a guide block adapted to be mounted to the motherboard to support the carrier in place from below, in which the guide block further comprises at least one lug sized and shaped to snap into a corresponding feature of the motherboard.

26. The assembly of claim 9, in combination with a printed circuit card.

27. The assembly of claim 9, further comprising EMI shielding.

28. The assembly of claim 27, in which the EMI shielding is adapted to permit access to the actuator from outside the electronics enclosure.

29. A printed circuit card carrier assembly, comprising:
   a) means for moving a printed circuit card perpendicularly towards and away from a motherboard,
   b) immovable carrier means for supporting the movable printed circuit card holder means
   c) actuator means for moving the movable printed circuit card holder means,
   the holder means and the actuator means being coupled together such that motion of the actuator is directed into perpendicular motion of the holder.

30. The assembly of claim 29, in which the holder means and actuator means are coupled together such that the motion of the actuator means is rotational.

31. The assembly of claim 29, in which the holder means and actuator means are coupled together such that the motion of the actuator means is horizontal.

32. The assembly of claim 29, further comprising means for ensuring that the holder means slides only perpendicularly towards and away from the motherboard.

33. The assembly of claim 29, further comprising means for accommodating printed circuit cards of varying heights.

34. The assembly of claim 29, in combination with guide block means for supporting the immovable carrier means in place from below.

35. The assembly of claim 29, in combination with a printed circuit card.

36. The assembly of claim 29, further comprising means for shielding electromagnetic interference.

37. A circuit card assembly, comprising:
   a motherboard;
   a carrier mounted adjacent and generally perpendicular to the motherboard, such that the carrier is generally immovable in the direction perpendicular to the motherboard,
   a relatively movable printed circuit card holder that slides along the carrier perpendicularly towards and away from the motherboard,
   an actuator movably supported by the carrier, the holder and the actuator being coupled together such that motion of the actuator is directed into perpendicular sliding motion of the holder.

38. The assembly of claim 37, further comprising a guide block mounted to the motherboard to support the carrier in place from a side of the motherboard opposite the carrier.

39. The assembly of claim 37, further comprising a guide block mounted to the motherboard to support the carrier in place from a side of the motherboard opposite the carrier, in which the carrier and the guide block each comprise one of a pair of complementary slots adapted to support the carrier perpendicular to the motherboard.

40. A circuit card assembly, comprising:

a motherboard;

a carrier mounted adjacent and generally perpendicular to the motherboard, such that the carrier is generally immovable in the direction perpendicular to the motherboard, a printed circuit card holder movable along the carrier, in a generally perpendicular motion towards and away from the motherboard, an actuator movably supported by the carrier, wherein the holder and the actuator are coupled together such that motion of the actuator is directed into perpendicular motion of the holder.

41. The assembly of claim 40, further comprising a guide block mounted to the motherboard to support the carrier in place from a side of the motherboard opposite the carrier.

42. The assembly of claim 40, further comprising a guide block mounted to the motherboard to support the carrier in place from a side of the motherboard opposite the carrier, in which the carrier and the guide block each comprise one of a pair of complementary slots adapted to support the carrier perpendicular to the motherboard.

* * * * *